(12) United States Patent
Yu et al.

(10) Patent No.: US 9,041,154 B2
(45) Date of Patent: May 26, 2015

(54) CONTACT STRUCTURE AND SEMICONDUCTOR MEMORY DEVICE USING THE SAME

(71) Applicant: NANYA TECHNOLOGY CORP., Tao-Yuan Hsien (TW)

(72) Inventors: Chien-An Yu, Taipei (TW); Chih-Huang Wu, Taoyuan County (TW)

(73) Assignee: NANYA TECHNOLOGY CORP., Gueishan Dist., Taoyuan, Taiwan (CN)

( * ) Notice: Subject to any disclaimer, the term of this patent is extended or adjusted under 35 U.S.C. 154(b) by 0 days.

(21) Appl. No.: 13/786,463

(22) Filed: Mar. 6, 2013

(65) Prior Publication Data

US 2014/0252545 A1    Sep. 11, 2014

(51) Int. Cl.
| | |
|---|---|
| *H01L 29/00* | (2006.01) |
| *H01L 27/04* | (2006.01) |
| *H01L 23/522* | (2006.01) |
| *H01L 27/06* | (2006.01) |
| *H01L 27/108* | (2006.01) |
| *H01L 49/02* | (2006.01) |

(52) U.S. Cl.
CPC ............ *H01L 27/04* (2013.01); *H01L 23/5223* (2013.01); *H01L 27/0629* (2013.01); *H01L 27/10876* (2013.01); *H01L 27/10894* (2013.01); *H01L 28/40* (2013.01); *H01L 28/60* (2013.01); *H01L 27/10852* (2013.01); *H01L 27/10888* (2013.01); *H01L 28/91* (2013.01); *Y10S 257/906* (2013.01)

(58) Field of Classification Search
CPC ....... H01L 28/40; H01L 28/60; H01L 27/108; H01L 23/5223; H01L 27/10852; H01L 27/0629; H01L 27/0805; H01L 27/10876; H01L 27/10894; H01L 27/10855; H01L 28/75; H01L 2924/01074; H01L 21/28568; H01L 27/1085; H01L 28/57; H01L 27/11526; H01L 27/10808; H01L 2924/01022; H01L 2924/04941; H01L 21/76841; H01L 21/321
USPC .......... 257/532, 71, 296, 301, 303, 306, 383, 257/906, 298, E27.084, E21.646
See application file for complete search history.

(56) References Cited

U.S. PATENT DOCUMENTS

| | | | | |
|---|---|---|---|---|
| 5,604,696 | A * | 2/1997 | Takaishi | 365/149 |
| 5,837,577 | A * | 11/1998 | Cherng | 438/253 |
| 6,271,596 | B1 * | 8/2001 | Alers | 257/774 |
| 6,670,663 | B2 * | 12/2003 | Hwang et al. | 257/296 |
| 6,720,232 | B1 * | 4/2004 | Tu et al. | 438/396 |
| 7,557,013 | B2 * | 7/2009 | Bhat et al. | 438/396 |
| 2003/0009112 | A1 * | 1/2003 | Hammerle et al. | 600/547 |
| 2007/0004133 | A1 * | 1/2007 | Kim et al. | 438/253 |
| 2007/0170484 | A1 * | 7/2007 | Horii | 257/296 |
| 2008/0150078 | A1 * | 6/2008 | Houston | 257/532 |
| 2011/0117718 | A1 * | 5/2011 | Nakamura et al. | 438/387 |
| 2011/0298026 | A1 * | 12/2011 | Jansen et al. | 257/296 |

* cited by examiner

*Primary Examiner* — Thien F Tran
(74) *Attorney, Agent, or Firm* — Winston Hsu; Scott Margo

(57) ABSTRACT

A semiconductor memory device includes a substrate having thereon a memory array region and a periphery circuit region. A first dielectric layer covers the memory array region and the periphery circuit region on the substrate. A second dielectric layer covers the memory array region and the periphery circuit region on the first dielectric layer. At least a capacitor structure is provided in the memory array region. The capacitor structure includes an electrode material layer embedded in the second dielectric layer. The semiconductor memory device further includes a contact structure comprising the electrode material layer.

9 Claims, 3 Drawing Sheets

CONTACT STRUCTURE AND SEMICONDUCTOR MEMORY DEVICE USING THE SAME

BACKGROUND OF THE INVENTION

1. Field of the Invention

The invention relates to a contact structure and semiconductor memory device using the same. More particularly, the invention relates to a contact structure that can be disposed in a densely packed memory array for picking up address lines within the memory array region.

2. Description of the Prior Art

A continuous challenge in the semiconductor industry is to decrease the size of memory cell components in order to increase the packing density of the DRAM chip. Over the last few device generations, DRAM manufacturers have developed alternative cell layouts that reduce the area they occupy on the chip. The latest designs allow a significant increase in density by burying the address lines in the silicon substrate, then fabricating the transistor and capacitor on top to form a vertical stack.

In current DRAM process, additional process steps are required to connect M1 contacts to extended address lines such as bit lines at the periphery area adjacent to the array edge. For a memory array having densely packed memory cells and each cell having four square feature area (4F2), there is typically no option to pick up the bit lines within the array, particularly at the array center. Therefore, the circuit layout application is limited and the die size is increased. It is desirable to provide an improved contact structure that can be disposed within a memory array having densely packed memory cells for picking up address lines.

SUMMARY OF THE INVENTION

It is one objective to provide an improved contact structure in order to solve the above-mentioned prior art problems and shortcomings.

From one aspect of this invention, a semiconductor memory device is disclosed. The semiconductor memory device includes a substrate having thereon a memory array region and a periphery circuit region; a first dielectric layer covering the memory array region and the periphery circuit region on the substrate; a second dielectric layer covering the memory array region and the periphery circuit region on the first dielectric layer; at least a capacitor structure in the memory array region, the capacitor structure comprising an electrode material layer embedded in the second dielectric layer; and a contact structure comprising the electrode material layer.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the embodiments, and are incorporated in and constitute a part of this specification. The drawings illustrate some of the embodiments and, together with the description, serve to explain their principles. In the drawings.

Figure 1:
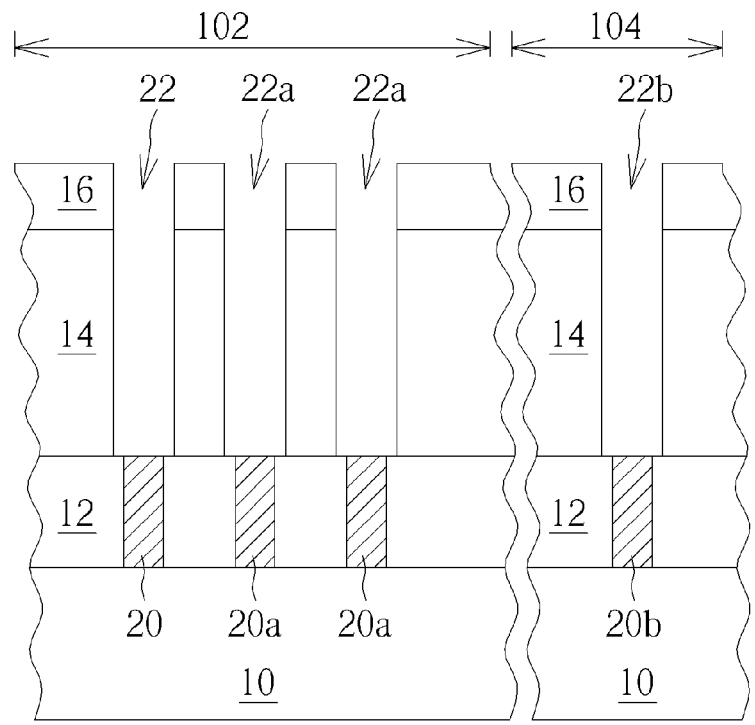
FIGS. 1-5 illustrate an exemplary method for fabricating a contact structure according to one embodiment of the invention.

It should be noted that all the figures are diagrammatic. Relative dimensions and proportions of parts of the drawings have been shown exaggerated or reduced in size, for the sake of clarity and convenience in the drawings. The same reference signs are generally used to refer to corresponding or similar features in modified and different embodiments.

DETAILED DESCRIPTION

In the following detailed description of the invention, reference is made to the accompanying drawings, which form a part hereof, and in which is shown, by way of illustration, specific embodiments in which the invention may be practiced. These embodiments are described in sufficient detail to enable those skilled in the art to practice the invention. Other embodiments may be utilized and structural, logical, and electrical changes may be made without departing from the scope of the present invention.

The terms wafer and substrate used herein include any structure having an exposed surface onto which a layer is deposited according to the present invention, for example, to form the integrated circuit (IC) structure. The term substrate is understood to include semiconductor wafers. The term substrate is also used to refer to semiconductor structures during processing, and may include other layers that have been fabricated thereupon. Both wafer and substrate include doped and undoped semiconductors, epitaxial semiconductor layers supported by a base semiconductor or insulator, as well as other semiconductor structures well known to one skilled in the art.

The present invention pertains to a contact structure that can be disposed within a memory array having densely packed memory cells. However, it is understood that the disclosed contact structure may be disposed at the periphery circuit area outside the memory array region. For example, the disclosed contact structure may be applicable to bit line pick-up contact, periphery devices, word line stitch, or hieratical digit line schemes. It is also understood that a memory cell typically consists of a capacitor and a transistor. The invention is thought to have particular significance in applications to dynamic random access memory (DRAM) cell structures with stacked cell layouts and buried bit/word lines, and to integrated circuitry incorporating such DRAM cell structures, wherein each DRAM cell occupies a 4F2 area (F: minimum feature size).

FIGS. 1-5 illustrate an exemplary method for fabricating a contact structure that is compatible and integrated with current stack capacitor process according to one embodiment of the invention. As shown in FIG. 1, a substrate 10 is provided. For the sake of simplicity, the devices such as transistors or isolation structures fabricated in the substrate 10 are not shown. On the surface of the substrate 10, a first dielectric layer 12 is deposited. A plurality of studs or plugs 20, 20a and 20b are inlaid into the first dielectric layer 12. For example, the plugs 20, 20a are fabricated within a memory array region 102, while the plugs 20b (only one of which is shown) are fabricated within a periphery circuit region 104 that may be adjacent to the memory array region 102. According to the embodiment, the plugs 20, 20a and 20b may be made of tungsten. According to this embodiment, the plugs 20 are to be coupled to a capacitor, more particularly, to a bottom electrode, of a memory cell, while each of the plugs 20a and 20b acts as pedestal of a corresponding contact structure for the purposes of picking up bit lines or stitching word lines for example. For example, each of the plugs 20 may be electrically connected to a drain or source of a vertical-channel transistor.

Stilling referring to FIG. 1, after the formation of the plugs 20, 20a and 20b, a second dielectric layer 14 such as BPSG or the like is deposited overlying the first dielectric layer 12 and the plugs 20, 20a and 20b. A hard mask layer 16 such as a silicon nitride layer is deposited over the second dielectric layer 14. The combined thickness of the second dielectric layer 14 and the hard mask layer 16 determines approximately the height of the capacitors of the memory cells in the memory array region 102. Subsequently, a conventional photolithographic process and an etching process are carried out to etch openings 22, 22a and 22b into the hard mask layer 16 and the second dielectric layer 14. The openings 22, 22a and 22b expose the plugs 20, 20a and 20b respectively.

Figure 2:
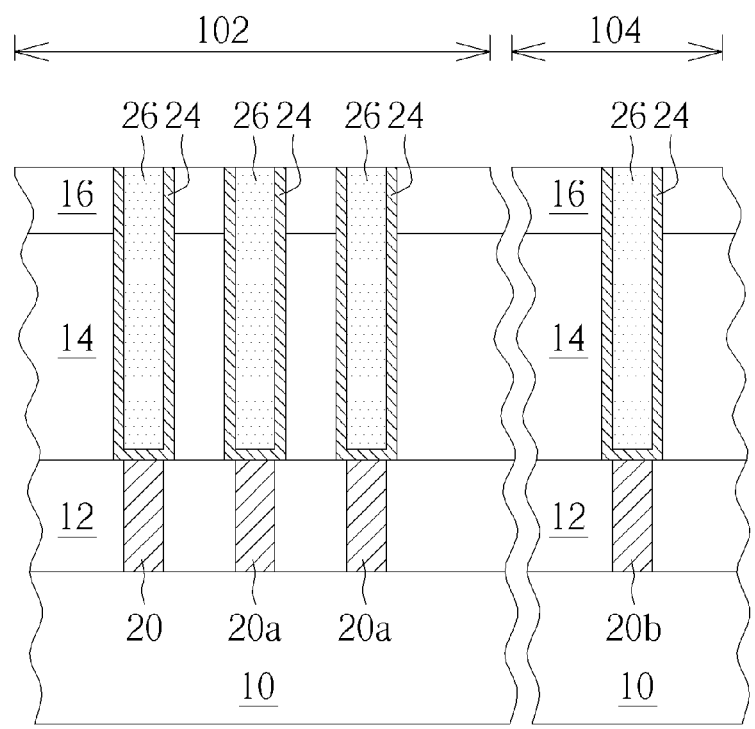

As shown in FIG. 2, an electrode material layer 24 such as titanium nitride layer or the like is then conformally deposited over the substrate 10. The electrode material layer 24 conformally covers the top surface of the hard mask layer 16 and the interior surfaces of the openings 22, 22a and 22b. It is noted that the electrode material layer 24 does not fill up the openings 22, 22a and 22b. Thereafter, a sacrificial layer 26 such as photoresist is applied onto the electrode material layer 24 to fill up the openings 22, 22a and 22b. A chemical mechanical polishing (CMP) process may be carried out to remove excess sacrificial layer 26 and electrode material layer 24 outside the openings 22, 22a and 22b by using the hard mask layer 16 as a polishing stop. After the CMP process, the top surface of the hard mask layer 16 is flush with the top surface of the polished sacrificial layer 26.

Figure 3:
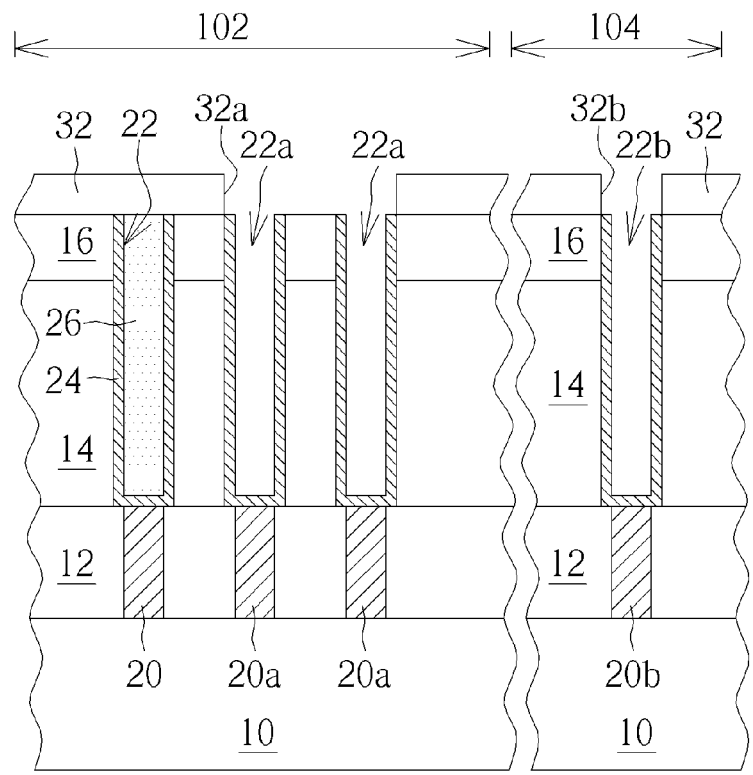

As shown in FIG. 3, a low-temperature chemical vapor deposition (CVD) process is then carried out to deposit a third dielectric layer 32 such as silicon dioxide or silicon nitride over the substrate 10. According to the embodiment, the aforesaid low-temperature CVD process may comprise atomic layer deposition (ALD) process. The third dielectric layer 32 covers the top surface of the hard mask layer 16 and the top surface of the polished sacrificial layer 26. A conventional photolithographic process and an etching process are performed to form openings 32a and 32b within the memory array region 102 and the periphery circuit region 104 respectively. The opening 32a expose the sacrificial layer 26 in the opening 22a while the opening 32b expose the sacrificial layer 26 in the opening 22b. Subsequently, using the patterned third dielectric layer 32 as a hard mask, a dry etching process or the like is performed to completely remove the sacrificial layer 26 from the openings 22a and 22b, thereby exposing the electrode material layer 24 in the openings 22a and 22b.

Figure 4:
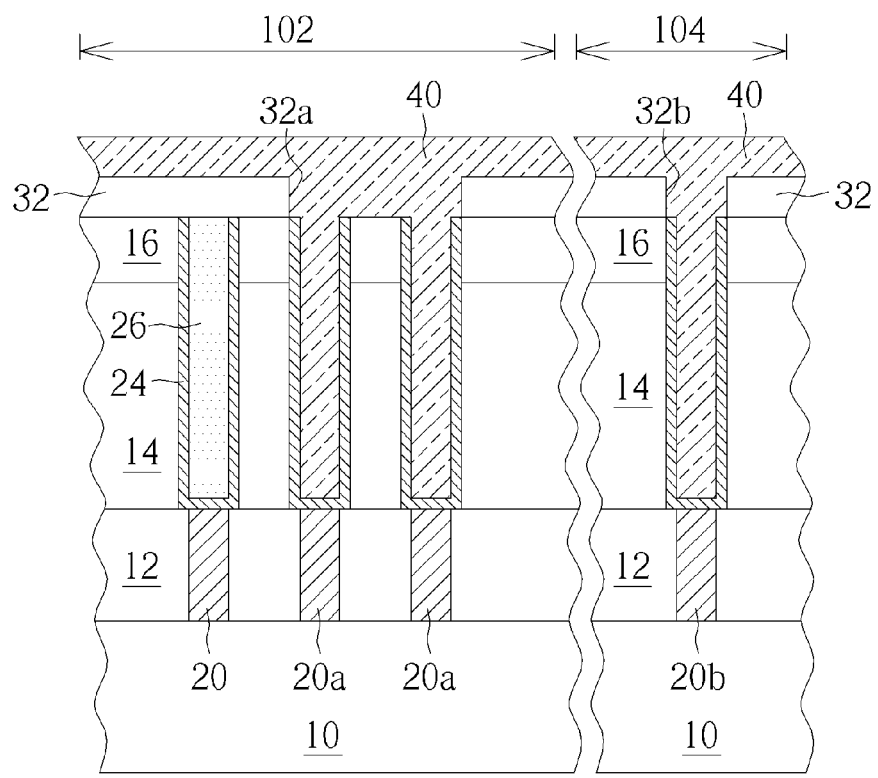

As shown in FIG. 4, a contact material layer 40 is then deposited onto the substrate 10. Since the dimensions of the openings 22a and 22b are usually very small, it is preferably to use ALD process to deposit the contact material layer 40 in order to make sure that the openings 22a and 22b are completely filled and no voids or gaps are formed therein. According to the embodiment, the contact material layer 40 may be composed of titanium, titanium nitride or the like.

Figure 5:
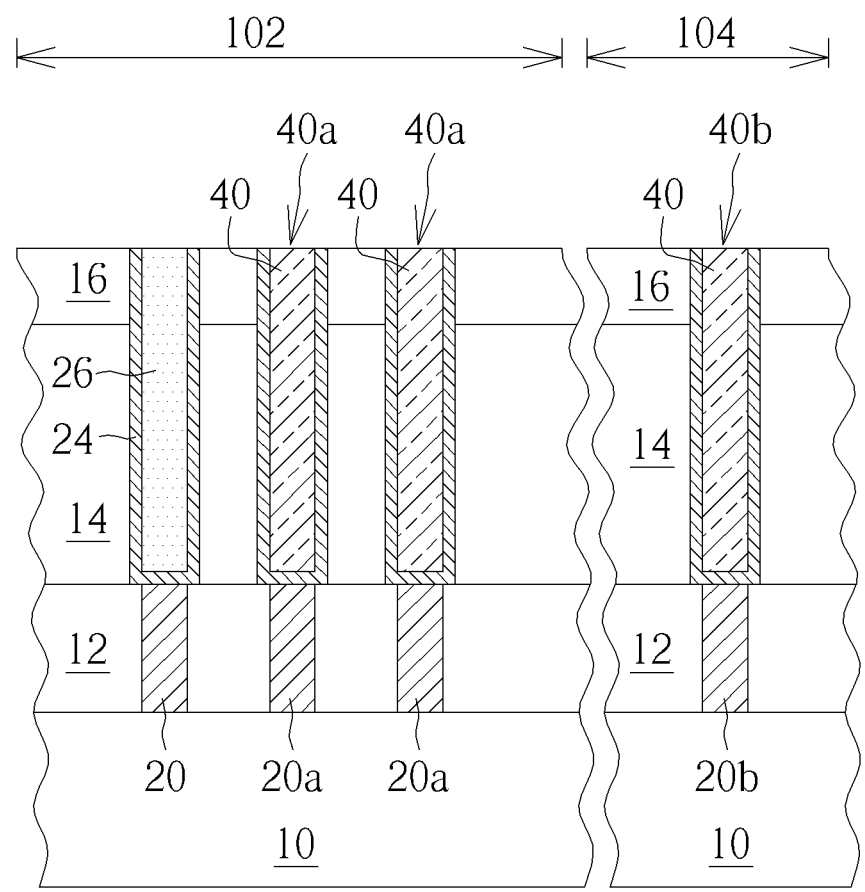

As shown in FIG. 5, after the deposition of the contact material layer 40, a CMP process may be carried out to remove excess contact material layer 40 outside the openings 22a and 22b. Preferably, the third dielectric layer 32 is also removed to expose the sacrificial layer 26 in the opening 22 and the top surface of the hard mask layer 16, thereby forming the contact structures 40a in the memory array region 102 and the contact structure 40b in the periphery circuit region 104. Following the integrated contact forming process as described above, a plurality of steps may be performed to fabricate the rest parts of the capacitor within the memory array region 102. For example, the sacrificial layer 26 in the opening 22 is first removed to reveal the electrode material layer 24 in the opening 22, which may act as a bottom electrode of the capacitor. A capacitor dielectric layer (not shown) may be deposited on the bottom electrode. Subsequently, a top electrode (not shown) may be deposited on the capacitor dielectric layer.

It is advantageous to use the present invention because the contact process is integrated with the capacitor forming process. By using the disclosed method, M1 to bit line (M1-BL) contact may be disposed at the memory array center to pick up bit lines or address lines. Therefore, there is no need to extend the bit lines to the periphery circuit region and the die size can be reduced. Furthermore, the contact structure in the periphery circuit region may be also integrated with the capacitor forming process. Therefore, the conventional pick-up contact at the array edge may be spared to save cost.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor memory device, comprising:
 a substrate having thereon a memory array region and a periphery circuit region;
 a first dielectric layer covering the memory array region and the periphery circuit region on the substrate;
 a second dielectric layer covering the memory array region and the periphery circuit region on the first dielectric layer;
 a hard mask layer on the second dielectric layer;
 a first plug and a second plug inlaid only in the first dielectric layer such that a top surface of the first plug and a top surface of the second plug are flush with a top surface of the first dielectric layer;
 a first opening within the memory array region, wherein the first opening is disposed directly above the first plug to thereby expose a top surface of the first plug;
 a second opening within the memory array region, wherein the second opening is disposed directly above the second plug to thereby expose a top surface of the second plug, wherein both of the first opening and the second opening penetrate through only the second dielectric layer and the hard mask layer, and have a substantially same height;
 at least a capacitor structure in the first opening, the capacitor structure comprising an electrode material layer embedded in the second dielectric layer; and
 a contact structure in the second opening comprising the electrode material layer and a contact material layer on the electrode material layer, wherein the contact material layer is in direct contact with the electrode material layer, and wherein the second opening is completely filled with the contact material layer, wherein the contact material layer has a top surface that is flush with a top surface of the hard mask layer.

2. The semiconductor memory device according to claim 1 wherein the first plug is electrically connected to a bottom electrode of the capacitor structure.

3. The semiconductor memory device according to claim 1 wherein the second plug is electrically connected to the contact structure.

4. The semiconductor memory device according to claim 1 wherein the electrode material layer lines interior surfaces of the first opening and the second opening.

5. The semiconductor memory device according to claim 1 wherein the first and second plugs are tungsten plugs.

6. The semiconductor memory device according to claim 1 wherein the contact structure is disposed within the memory array region.

7. The semiconductor memory device according to claim 1 wherein the contact structure is disposed within the periphery circuit region.

8. The semiconductor memory device according to claim 1 wherein the electrode material layer comprises titanium nitride.

9. The semiconductor memory device according to claim 1 wherein the contact material layer comprises titanium or titanium nitride.

* * * * *

UNITED STATES PATENT AND TRADEMARK OFFICE
CERTIFICATE OF CORRECTION

PATENT NO. : 9,041,154 B2
APPLICATION NO. : 13/786463
DATED : May 26, 2015
INVENTOR(S) : Chien-An Yu et al.

It is certified that error appears in the above-identified patent and that said Letters Patent is hereby corrected as shown below:

On the title page, item (73), correct the country of the assignee from "CN" to --TW--

Signed and Sealed this
Twenty-seventh Day of October, 2015

Michelle K. Lee
*Director of the United States Patent and Trademark Office*